(12) United States Patent
Holt et al.

(10) Patent No.: US 12,426,315 B2
(45) Date of Patent: Sep. 23, 2025

(54) IC DEVICE WITH VERTICALLY-GRADED SILICON GERMANIUM REGION ADJACENT DEVICE CHANNEL AND METHOD FOR FORMING

(71) Applicant: GlobalFoundries U.S. Inc., Malta, NY (US)

(72) Inventors: Judson Robert Holt, Ballston Lake, NY (US); George Robert Mulfinger, Queensbury, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 431 days.

(21) Appl. No.: 18/161,219

(22) Filed: Jan. 30, 2023

(65) Prior Publication Data
US 2024/0258376 A1 Aug. 1, 2024

(51) Int. Cl.
*H10D 30/69* (2025.01)
*H10D 84/01* (2025.01)
*H10D 84/03* (2025.01)

(52) U.S. Cl.
CPC ....... *H10D 30/751* (2025.01); *H10D 84/0167* (2025.01); *H10D 84/038* (2025.01)

(58) Field of Classification Search
CPC .. H10D 30/60; H10D 30/673; H10D 30/6757; H10D 30/751
See application file for complete search history.

(56) References Cited

U.S. PATENT DOCUMENTS

| | | | | |
|---|---|---|---|---|
| 5,777,364 | A | * | 7/1998 | Crabbe ................ H10D 30/473 257/E29.05 |
| 5,821,577 | A | * | 10/1998 | Crabbe' ............... H10D 30/751 257/E29.05 |
| 9,859,423 | B2 | | 1/2018 | Liu et al. |
| 2015/0270344 | A1 | | 9/2015 | Cheng et al. |
| 2017/0256565 | A1 | * | 9/2017 | Nummy ................ H10D 86/01 |
| 2018/0069091 | A1 | | 3/2018 | Mulfinger et al. |
| 2019/0312109 | A1 | | 10/2019 | Niebokewski et al. |
| 2020/0044029 | A1 | | 2/2020 | Mulfinger et al. |

OTHER PUBLICATIONS

European Search Report for corresponding EP Application No. 23197357.9-1020 dated Mar. 6, 2024, 5 pages.
U.S. Appl. No. 17/968,404, filed Oct. 18, 2022; pp. 22.

* cited by examiner

*Primary Examiner* — Tuan A Hoang
(74) *Attorney, Agent, or Firm* — Anthony Canale; Hoffman Warnick LLC

(57) ABSTRACT

An integrated circuit (IC) device is disclosed which includes a first transistor over a substrate. The first transistor includes a gate over the substrate and between a source region and a drain region. The transistor further includes a first region of vertically-graded silicon germanium ("SiGe") adjacent a first side of a channel under the gate, and a second region of vertically-graded SiGe adjacent a second side of the channel. The channel includes substantially uniformly-graded SiGe.

20 Claims, 10 Drawing Sheets

IC DEVICE WITH VERTICALLY-GRADED SILICON GERMANIUM REGION ADJACENT DEVICE CHANNEL AND METHOD FOR FORMING

TECHNICAL FIELD

Embodiments of the disclosure relate generally to integrated circuit devices with vertically-graded silicon germanium regions and method for forming the same.

BACKGROUND

Field-effect transistors (FETs) are integrated circuit devices that are the base unit of microelectronic circuits, each FET having a threshold voltage, often denoted as Vth. Once the threshold voltage is applied to the FET terminals, the device becomes operational, i.e., charge carriers flow through the channel. To optimize power consumption, it is often desirable to increase the Vth of a given FET. Thus, IC manufacturers make design choices that balance, for example, Vth values with device performance, chip yield, etc. In fully-depleted semiconductor-on-insulator devices, one way Vth may be modulated is by varying the amount of germanium within or around a device channel. However, varying germanium concentration profiles within the device channel may increase fabrication cost and complexity. Additionally, varying germanium concentration profiles within the device channel can lead to defects, such as erosion or agglomeration, within or around the channel, resulting in lower yields, i.e., less functional chips per wafer or chips with unacceptable performance metrics.

SUMMARY

One aspect of the disclosure includes an integrated circuit (IC) device, comprising: a substrate; a first transistor over the substrate, including: a gate over the substrate and between a source region and a drain region, a first region of vertically-graded silicon germanium ("SiGe") adjacent a first side of a channel under the gate, and a second region of vertically-graded SiGe adjacent a second side of the channel, wherein the channel includes substantially uniformly-graded SiGe.

Another aspect of the disclosure includes an integrated circuit (IC) device, comprising: a first transistor in a device layer over a fully-depleted semiconductor-on-insulator (FD-SOI) substrate, including: a gate over the FD-SOI substrate and between a source and a drain; and a channel under the gate and between a first portion of silicon-germanium (SiGe) and a second portion of SiGe, wherein the channel is of a higher germanium concentration than a germanium concentration of the first portion of SiGe and a germanium concentration of the second portion of SiGe; and a second transistor in the device layer, including: a gate over the FD-SOI substrate and between a source and a drain; and a channel under the gate, wherein the channel of the second transistor is thinner than the first and second portions of SiGe of the first transistor.

Another aspect of the disclosure includes an integrated circuit (IC) structure, comprising: forming a first transistor over a substrate, including: forming a channel including substantially uniformly-graded silicon-germanium (SiGe) within the substrate, forming a gate over the channel, forming a source region and a drain region on opposing sides of the gate; forming a first region of vertically-graded SiGe adjacent a first side of the channel, and forming a second region of vertically-graded SiGe adjacent a second side of the channel.

BRIEF DESCRIPTION OF THE DRAWINGS

The embodiments of this disclosure will be described in detail, with reference to the following figures, wherein like designations denote like elements, and wherein.

Figure 1A:
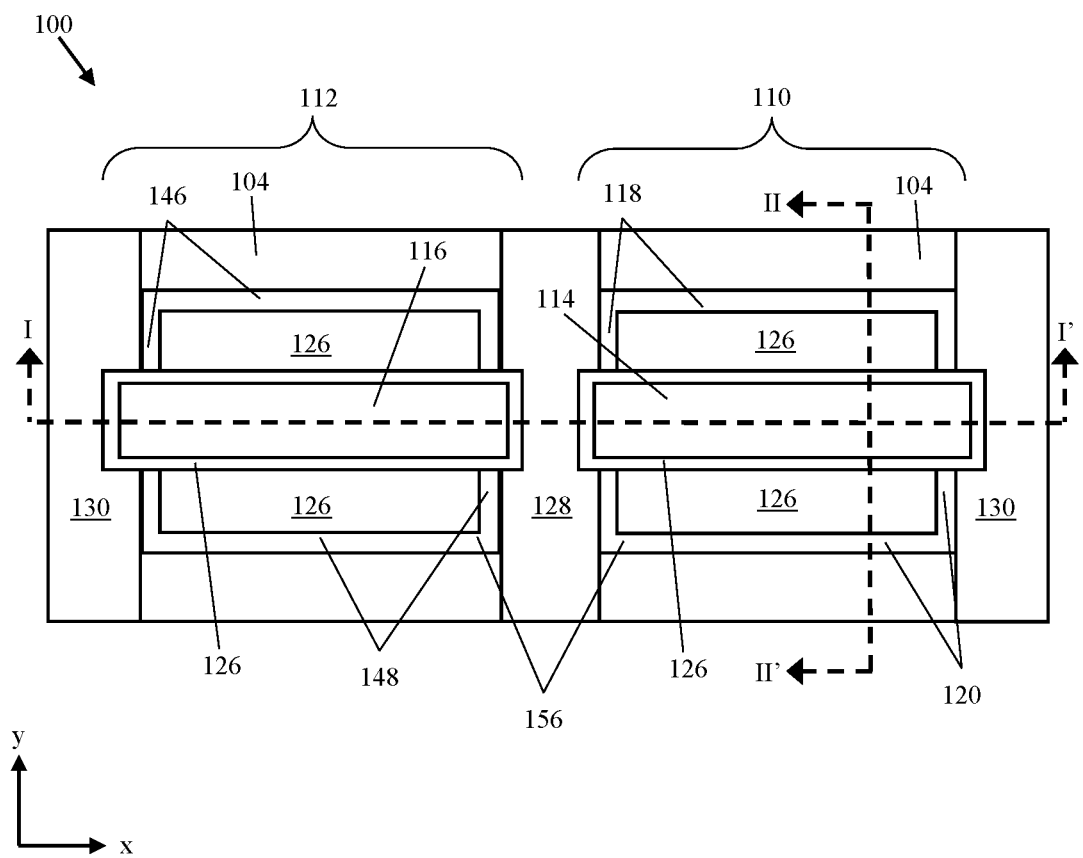
FIG. 1A shows an overhead view of an integrated circuit (IC) device including a transistor with regions of vertically-graded silicon germanium, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

"Defect" may include an agglomeration, erosion, an absence of material (e.g., a void), or other process-related damage at a given location within integrated circuit devices described herein. "Agglomeration" means an undesirable accumulation of materials. "Erosion" refers to diminishing, deteriorating, or otherwise destroying portions within the integrated circuit (IC) device described herein. Erosion may occur, for example, through one material undesirably bonding to another material, or through chemical or thermal damage.

"Condensed" silicon germanium refers to silicon germanium layers that are subsequently processed to have reduced volume relative to "uncondensed" silicon germanium. Typically, a condensed silicon germanium layer has a higher germanium concentration than an uncondensed silicon germanium layer because of the volume reduction caused by subsequent processing, notwithstanding that the two will have the same or near same total number of germanium atoms therein. In either condensed or uncondensed silicon germanium, the germanium atoms may be substantially uniformly distributed or substantially non-uniformly distributed, e.g., silicon germanium with vertically- or horizontally-graded concentration profile.

"Vertically-graded" refers to a concentration profile wherein the added germanium atoms (dopant) are denser at the top and become more diffuse, i.e., less dense, as the germanium atoms extend lower toward a bottom of the material. Alternatively, the reverse may be true, wherein the concentration may be higher near or at the bottom and become diffuse towards a top of the material.

Embodiments of the disclosure include an integrated circuit (IC) device. The IC device may include a substrate and a first transistor thereover. The first transistor may include a gate over the substrate and between a source region and a drain region. The first transistor may further include a first region of vertically-graded SiGe adjacent a first side of a channel under the gate, and a second region of vertically-graded SiGe adjacent a second side of the channel. The channel may include substantially uniformly-graded SiGe. By including regions of vertically-graded SiGe adjacent the sides of the first transistor channel, the channel may thereby be protected from defects such as agglomeration, voids, erosion, and other processing issues that affect device performance and chip yields. Moreover, the regions of vertically-graded SiGe adjacent the sides of the first transistor channel may further allow the threshold voltage of the first transistor to be modulated in a way that is relatively inexpensive, requires few or no further processing steps, and increases device performance.

Figure 1B:
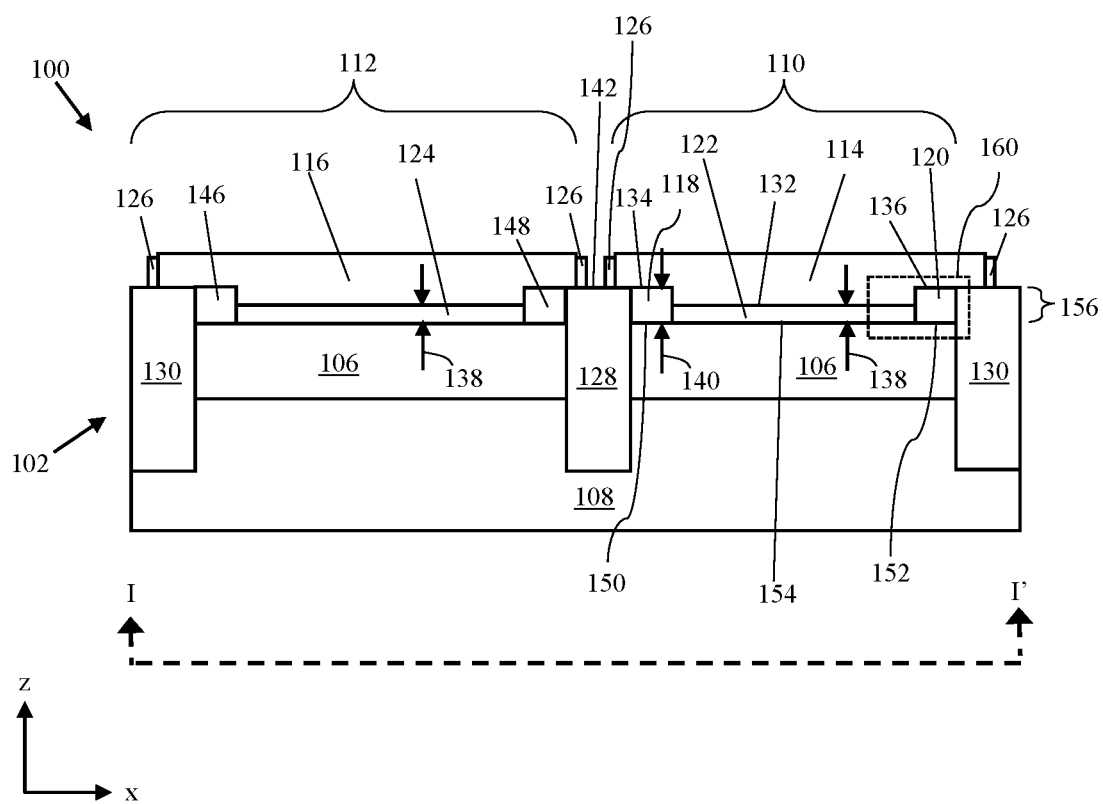
FIG. 1B shows a cross-sectional view of an integrated circuit (IC) device including regions of vertically-graded silicon germanium, according to embodiments of the disclosure.
Figure 1C:
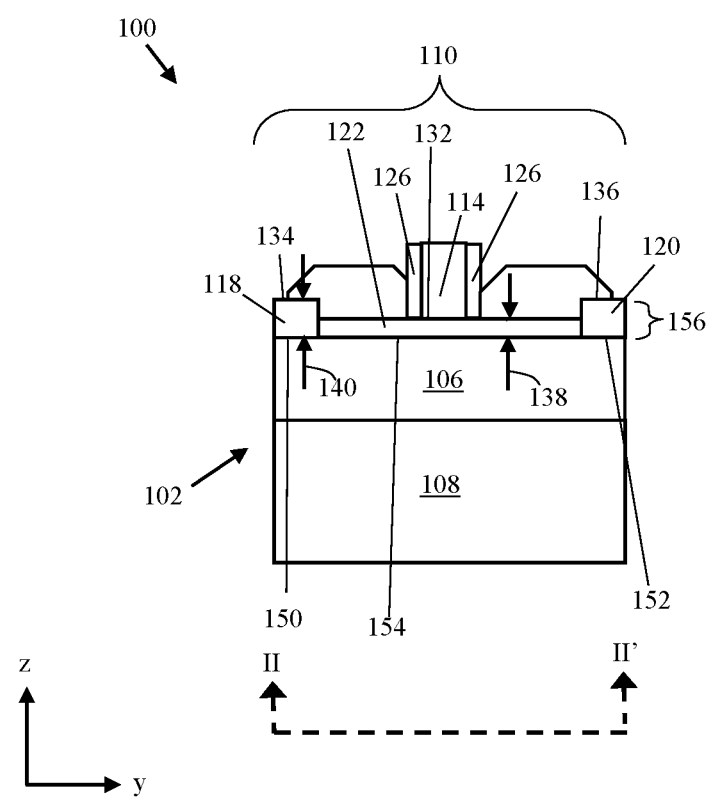
FIG. 1C shows a cross-sectional view of an integrated circuit (IC) device including regions of vertically-graded silicon germanium, according to embodiments of the disclosure.

FIGS. 1A-1D show an integrated circuit (IC) device 100 (referred to simply as "device 100") according to embodiments of this disclosure. FIG. 1A is a top-down view of device 100 and FIGS. 1B and 1C illustrate cross-sectional cuts of device 100 in directions perpendicular to one another. FIG. 1B is a cross-section from I to I' (i.e., in the x-direction) while FIG. 1C is a cross-section from II to II' (i.e., the y-direction). Embodiments of device 100 include a semiconductor substrate 102 (referred to simply as "substrate 102"). For purposes of description, semiconductor substrate 102 is illustrated and described as a semiconductor-on-insulator (SOI) substrate. SOI substrates include a layered semiconductor-insulator-semiconductor substrate in place of a more conventional silicon substrate (bulk substrate). SOI substrate 102 includes a semiconductor-on-insulator (SOI) layer 104 over a buried insulator layer 106 over a base semiconductor layer 108. In one embodiment shown in FIGS. 1B and 1C, SOI substrate 102 includes a fully depleted semiconductor-on-insulator, or FD-SOI, substrate. FD-SOI provides better transistor electrostatic characteristics compared to bulk semiconductor technology. Thus, for purposes of description, substrate 102 is illustrated and described as an FD-SOI substrate.

SOI layer 104 and/or base semiconductor layer 108 may include an intrinsic or extrinsic semiconductor. In the structures and method described herein, semiconductor material includes conducting properties can be altered by doping with an impurity. Semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material is not doped with an impurity for the purposes of increasing conductivity (i.e., an undoped semiconductor material) is referred to in the art as an "intrinsic semiconductor." A semiconductor material that is doped with an impurity for the purposes of increasing conductivity (i.e., a doped semiconductor material) is referred to in the art as an "extrinsic semiconductor" and will be more conductive than an intrinsic semiconductor made of the same base material. That is, extrinsic silicon will be more conductive than intrinsic silicon; extrinsic silicon germanium will be more conductive than intrinsic silicon germanium; and so on.

It should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, the initial semiconductor region or layer is more conductive (less resistive) than the other semiconductor region or layer; whereas, when a semiconductor region or layer is described as being at a lower conductivity level than another semiconductor region or layer, the initial semiconductor layer is less conductive (more resistive) than that other semiconductor region or layer.

Buried insulator layer 106 may take the form of an ultra-thin layer of insulator (often referred to in the art as "buried oxide" or simply "BOX") positioned on top of base semiconductor substrate 108. Buried insulator layer 106 may electrically and physically separate layers above from base semiconductor layer 108 and may include a dielectric material. Suitable dielectric materials include but are not limited to: silicon dioxide; carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. High-k dielectric materials may include metal oxides such as tantalum oxide (Ta2O5), barium titanium oxide (BaTiO3), hafnium oxide (HfO2), zirconium oxide (ZrO2), aluminum oxide (Al2O3) or metal silicates such as hafnium silicate oxide (HfA1SiA2OA3) or hafnium silicate oxynitride (HfA1SiA2OA3NA4), where A1, A2, A3, and A4 represent relative proportions, each greater than or equal to zero and A1+A2+A3+A4 (1 being the total relative mole quantity). The precise thickness of buried insulating layer 106 may vary widely with the intended application. In general, buried insulator layer 106 lowers the parasitic capacitance between the drain and source, and confines the electrons flowing from devices thereover, reducing leakage currents that damage performance.

SOI layer 104 over buried insulator layer 106 may be very thin per FDSOI technology. SOI layer 104 generally provides a channel for transistor devices. The ultra-thin SOI layer need not be doped to create a channel, thus making a given transistor "fully depleted." As discussed herein, a channel is a region in a transistor through which charge carriers may flow. In some embodiments, SOI layer 106 may include germanium, thereby making SOI layer 104 a silicon-germanium layer (simply "SiGe layer") 156. As discussed herein, SiGe layer 156 is a layer of SiGe over buried insulator layer 106 and may include germanium substantially uniformly distributed therein or vertically-graded.

Device 100 may include a first transistor 110 over base semiconductor layer 108. A transistor is the fundamental building block of integrated circuitry in, e.g., computers, cellular phones, and all other modern electronic devices. First transistor 110 may be a field-effect transistor ("FET"), which is a transistor that relies on an electric field to control the shape and hence the conductivity of the channel in a semiconductor material. FETs are sometimes used as voltage-controlled resistors. The terminals of FETs are designated source (S), drain (D) and gate (G).

Referring to FIGS. 1B and 1C, transistor 110 may include a gate 114 over SOI layer 104. Gate 114 functions as a gate terminal for first transistor 110. Applying a voltage to gate 114 will put first transistor 110 in an operational mode, e.g., enhancement, depletion, etc. Gate 114 may include any now known or later developed gate material. That is, although shown as a single material for clarity, gates may include one or more conductive components for providing a gate terminal of a transistor. For example, gates may include a high-k layer between the gate and, for example, a channel thereunder. The high-k layer may include any now known or later developed high-k material typically used for metal gates, such as those discussed previously. Gates may also include a work function metal layer and a gate conductor (not all shown for clarity). The work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor may include any now known or later developed gate conductor such as copper (Cu). A gate cap (not shown) of, for example, a nitride may also be over the gate region.

In one embodiment illustrated in FIG. 1B, gate 114 may extend at least partially or completely over a first region of vertically-graded silicon germanium (SiGe) 118 and a second region of vertically-graded SiGe 120 in the x-direction. As discussed in further detail below, first and second regions of vertically-graded SiGe 118 and 120 may be regions of a SiGe layer 156 where the germanium atoms within first and second regions of vertically-graded SiGe 118 and 120 are distributed such that the concentration profile of germanium within silicon decreases with decreasing distance towards buried insulator layer 106, i.e., the germanium concentration within first and second regions of vertically-graded SiGe 118 and 120 is vertically graded. When gate 114 is over first and second regions of vertically-graded SiGe 118 and 120, gate 114 may electrically connect first and second regions of vertically-graded SiGe 118 and 120 to, and physically separate first and second regions of vertically-graded SiGe 118 and 120 from, regions thereover (not shown).

First transistor 110 may include source/drain regions 126 on either side of gate 114. Source/drain regions 126 are doped regions that have an abundance of charge carriers, e.g., electrons and holes, that conduct when the threshold voltage is applied to gate 114. In some embodiments, source/drain regions 126 include germanium. In one embodiment, shown in FIG. 1C, source/drain regions 126 may partially extend over first and second regions of vertically-graded SiGe 118, 120.

Still referring to FIGS. 1A-1D, first transistor 110 may include channel 122 over buried insulator layer 106 and under gate 114. Channel 122 may include silicon-germanium, which, among other things, increases charge carrier mobility through the addition of charge carriers and/or straining the silicon lattice therein, thereby modulating the Vth of first transistor 110. Channel thickness may also affect Vth of first transistor 110. That is, when the thickness of channel 122 is changed, the Vth of first transistor 110 may change. Channel thickness and germanium concentration per unit volume may be inversely proportional. Specifically, when condensed, SiGe layer 156 includes a higher germanium concentration relative to uncondensed SiGe, i.e., the percent of germanium per unit volume increases. When channel 122 includes uncondensed SiGe and is subsequently condensed, thickness (i.e., volume) decreases and germanium concentration thereby increases. Moreover, germanium content may become substantially uniform throughout the silicon after condensation, i.e., the vertical germanium gradient substantially disappears. Thus, condensing all or some of SiGe layer 156 changes Vth of first transistor 110.

Device 100 may further include a SiGe layer 156 around transistor 110 and, optionally, around transistor 112, as shown in FIG. 1A. Because all of or parts of SiGe layer 156 may subsequently be condensed, SiGe layer 156 may include substantially uniformly distributed SiGe or vertically-graded SiGe, depending on fabrication methods discussed herein. As illustrated, SiGe layer 156 substantially surrounds first transistor 110, thereby physically enclosing channel 122 and source/drain regions 126 therein. SiGe layer 156 may optionally substantially surround the channel and source/drain regions of other devices on the chip, including channel 124 and source/drain regions 126 of second transistor 112, thereby providing a physical barrier to the regions therein. As illustrated, SiGe layer 156 may take the form of a substantially rectangular cross-sectional shape. However, SiGe layer 156 may take the form of any cross-sectional shape enclosing all, or partial regions of device 100.

SiGe layer 156 may include first region of vertically-graded SiGe 118 and second region of vertically-graded SiGe 120 adjacent first and second sides of channel 122 in first transistor 110. First region of vertically-graded SiGe 118 and second region of vertically-graded SiGe 120 are respective vertically-graded regions of SiGe layer 156. First and second regions of vertically-graded SiGe 118, 120 may be uncondensed portions of SiGe layer 156 and, therefore, may be incidentally fabricated when SiGe layer 156 is formed. Thus, first and second regions of vertically-graded SiGe 118, 120 may be two regions of a substantially continuous layer, i.e., SiGe layer 156. Moreover, as illustrated in FIG. 1A, first and second regions of vertically-graded SiGe 118, 120 may substantially surround channel 122 and source/drain regions 126 of first transistor 110. Third and fourth regions of vertically-graded SiGe 146, 148 may optionally substantially surround the channel and source/drain regions of other devices on the chip, including channel 124 and source/drain regions 126 of second transistor 112. Further, thicknesses of first and second regions of vertically-graded SiGe 118, 120 may be determined by the starting thickness of SOI layer 104 and the amount of germanium added during fabrication.

Figure 1D:
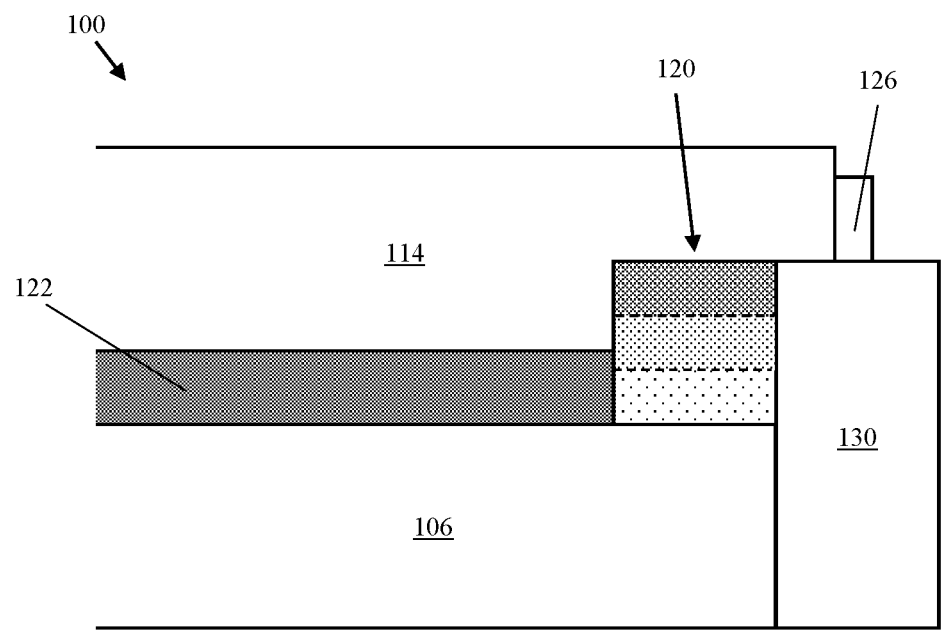
FIG. 1D shows an expanded cross-sectional view of an integrated circuit (IC) device including vertically-graded silicon germanium therein.

FIG. 1D shows an expanded view of box 160. Vertical grading of germanium within second region of vertically-graded SiGe 120 is illustrated by different shading that varies with vertical position in second region of vertically-graded SiGe 120. For example, the shading becomes less dense towards the bottom of second region of vertically-graded SiGe 120 in FIG. 1D, indicating the top of region 120 has more germanium than the bottom of region 120. Dashed lines within second region of vertically-graded SiGe 120 illustrating different germanium concentrations within second region of vertically-graded SiGe 120 are for clarity only and do not necessarily designate different layers or interfaces therebetween. Further, vertically-grading may be substantially continuous, rather than in bands. Moreover, although portions of second region of vertically-graded SiGe 120 are illustrated as having a distinct germanium composition as channel 122, region 120 may include portions that include germanium concentrations substantially the same as, or even greater than, the germanium concentration in channel 122. As described previously, channel 122 may include a higher concentration of germanium therein than a germanium concentration of first region of vertically-graded SiGe 118 and a germanium concentration of second region of vertically-graded SiGe 120. As illustrated, channel 122 may include substantially uniformly-graded SiGe. Although only second region of vertically-graded SiGe 120 is illustrated as vertically graded for clarity, other layers may include vertically-graded SiGe as described herein.

In one embodiment illustrated in FIGS. 1B and 1C, first region of vertically-graded SiGe 118 has a bottommost surface 150 and second region of vertically-graded SiGe 120 has a bottommost surface 152, each bottommost surface 150 and 152 substantially vertically aligned with a respective bottommost surface 154 of channel 122 i.e., bottommost surfaces 150, 152, and 154 are substantially coplanar. This arrangement may be a consequence of forming first and second regions of vertically-graded SiGe 118, 120 and channel 122 from the same uncondensed SiGe layer formed over buried insulator layer 106.

Because the threshold voltage of first transistor 110 may be a function of germanium concentration, in addition to being a function of channel thickness, placement of first and second regions of vertically-graded SiGe 118, 120 on either side of channel 122 advantageously allows device manufacturers to modulate the Vth of first transistor 110 by creating locally thicker portions of channel 122, i.e., first and second regions of vertically-graded SiGe 118, 120. Vth as a function of channel thickness and germanium concentration may be complex, however, and may therefore be determined experimentally. That is, it may be difficult to predict how exactly the Vth of an IC device is affected by changing the thickness of all or part of channel 122. Thus, one advantage of including first and second regions of vertically-graded SiGe 118 and 120 is that first and second regions of vertically-graded SiGe 118 and 120 advantageously allow Vth modulation in first transistor 110 with minimal or no further processing steps.

Certain embodiments of the disclosure include changing channel 122 thickness relative to first and second regions of vertically-graded SiGe 118, 120 or relative to other devices on the chip. For example, in one embodiment shown in FIGS. 1B and 1C, channel 122 may have an uppermost surface 132 below an uppermost surface 134 of first region of vertically-graded SiGe 118 and an uppermost surface 136 of second region of vertically-graded SiGe 120, thereby defining a thinner channel 122 relative to first and second regions of vertically-graded SiGe 118, 120. This arrangement is advantageous because when portions of first and second regions of vertically-graded SiGe 118 and 120 are above channel 122, first and second regions of vertically-graded SiGe 118 and 120 provide channel 122 additional physical protection from defects such as agglomeration or erosion. Thus, not only do first and second regions of vertically-graded SiGe 118 and 120 allow for Vth modulation, first and second regions of vertically-graded SiGe 118 and 120 also advantageously provide physical protection to channel 122. In another embodiment, channel 122 has a first vertical height 138, and first and second regions of vertically-graded SiGe 118, 120 have a second vertical height 140. First vertical height 138 may be approximately half of second vertical height 140. Thus, in this embodiment, channel 122 includes a higher concentration of SiGe than first and second regions of vertically-graded SiGe 118, 120, i.e., because channel 122 is condensed. In FIG. 1D, for example, channel 122 includes SiGe that is of a higher germanium concentration than a germanium concentration of first region of vertically-graded SiGe 118 and a germanium concentration of the second region of vertically-graded SiGe 120. In other embodiments, however, first vertical height 138 may be approximately 0.25× to 0.75× of second vertical height 140.

Referring to FIGS. 1A and 1B, device 100 may further include a second transistor 112 adjacent first transistor 110 in some embodiments. Second transistor 112 may be substantially similar to first transistor 110. That is, second transistor 112 may similarly include a gate 116 over substrate 102. Second transistor 112 differs from first transistor 110 in that second transistor 112 includes a channel 124 under gate 116 that includes intrinsic silicon. Intrinsic silicon is essentially pure silicon, i.e., substantially free of impurities such as dopants. Second transistor 112 may include source/drain regions 126 about channel 124, similar to first transistor 110.

In certain embodiments, such as the one shown in FIG. 1B, channel 124 of second transistor 112 has first vertical height 138. In contrast, first and second regions of vertically-graded SiGe 118, 120 of transistor 110 have second vertical height 140. As mentioned previously, first vertical height 138 may be approximately half of second vertical height 140 of first and second regions of vertically-graded SiGe 118, 120. The different vertical heights between channel 124 of second transistor 112 and channel region 122 of first transistor 110 compared to first and second regions of vertically-graded SiGe 118, 120 allow first transistor 110 and second transistor 112 to have different Vth values.

In yet another optional embodiment, shown in FIG. 1B, second transistor 112 may include a third region of vertically-graded SiGe 146 and a fourth region of vertically-graded SiGe 148 on either side of channel 124 of second transistor 112. Third and fourth regions of vertically-graded SiGe 146, 148 are substantially similar and manufactured simultaneously to first and second regions of vertically-graded SiGe 118, 120. Third and fourth regions of vertically-graded SiGe 146, 148 allow the Vth of second transistor 112 to be modulated while simultaneously physically protecting channel 124 from defects, e.g., agglomeration and erosion.

Device 100 may further include an isolation region 128 adjacent a first side of second transistor 112 and between first transistor 110 and second transistor 112. In one embodiment, uppermost surface 134 and 136 of first and second regions of vertically-graded SiGe 118 and 120, respectively, are substantially vertically aligned with an uppermost surface 142 of first region 128, i.e., uppermost surfaces 134, 136, and 142 are substantially coplanar. In some embodiments, such as one shown in FIG. 1B, device 100 may include additional isolation regions 130 adjacent the sides of first and second transistors 110, 112. Additional isolation regions 130 may be substantially similar to isolation region 128. Although two additional isolation regions 130 are illustrated, device 100 may include any number of isolation regions.

Figure 2:
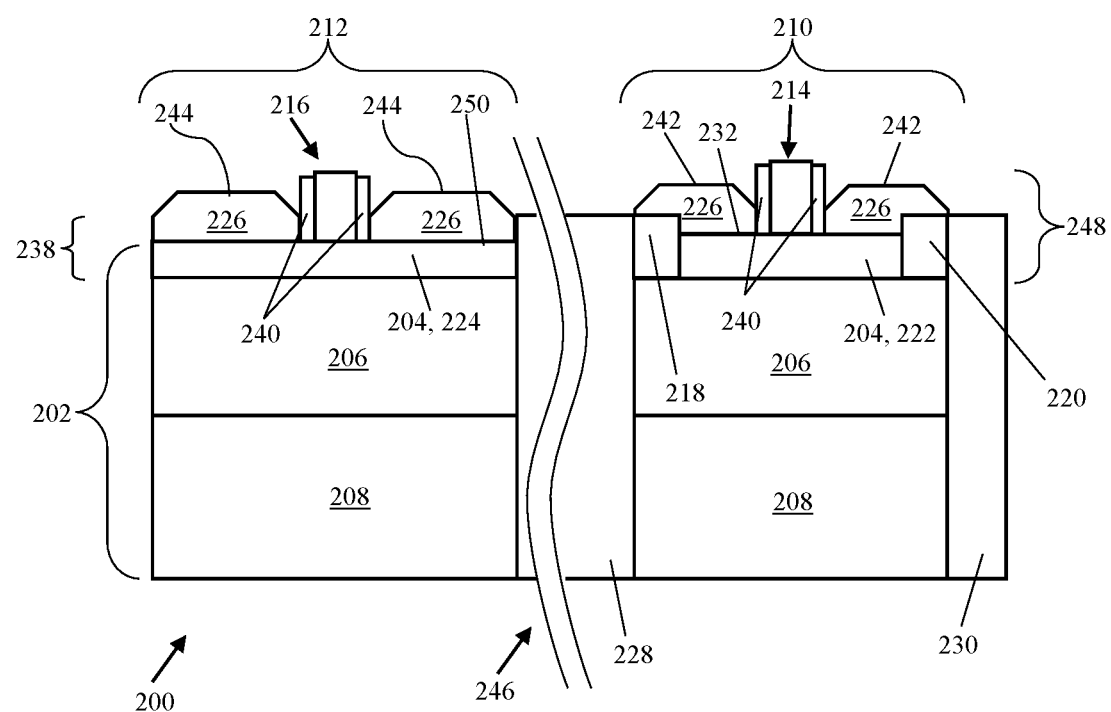
FIG. 2 shows a cross-sectional view of an IC device including regions of vertically-graded silicon germanium, according to other embodiments of the disclosure.
Figure 3:
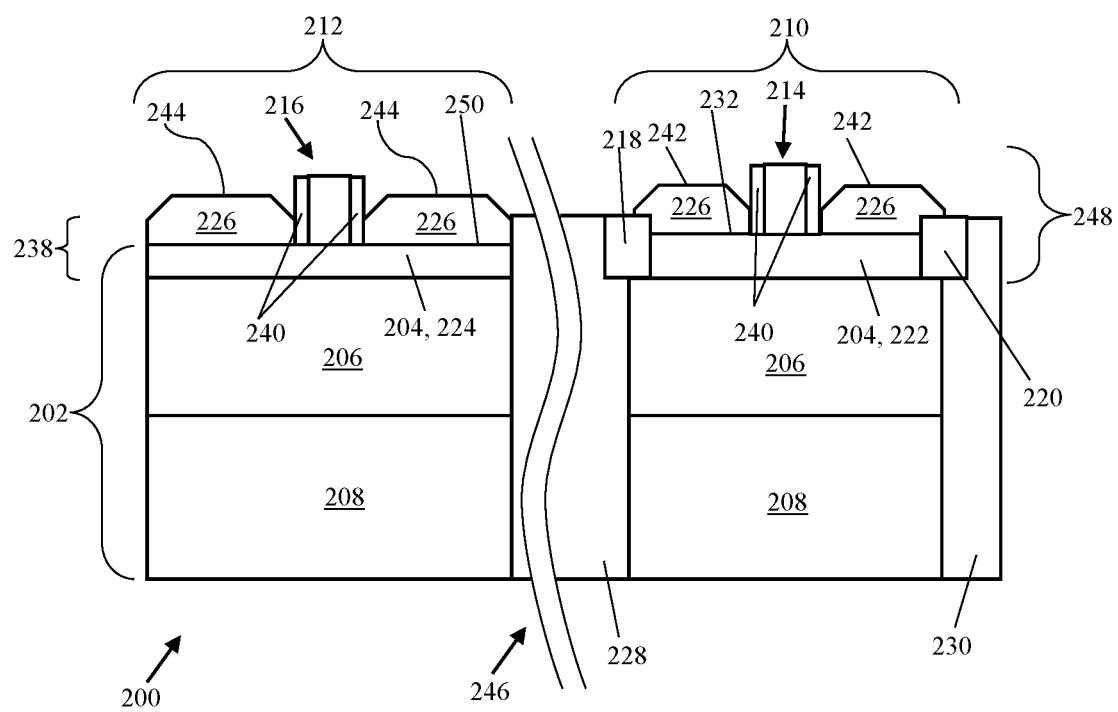
FIG. 3 shows a cross-sectional view of an IC device including a channel that is of a higher germanium concentration than a germanium concentration of first region of vertically-graded SiGe and a germanium concentration of a second region of vertically-graded SiGe adjacent thereto, according to embodiments of the disclosure.
Figure 4:
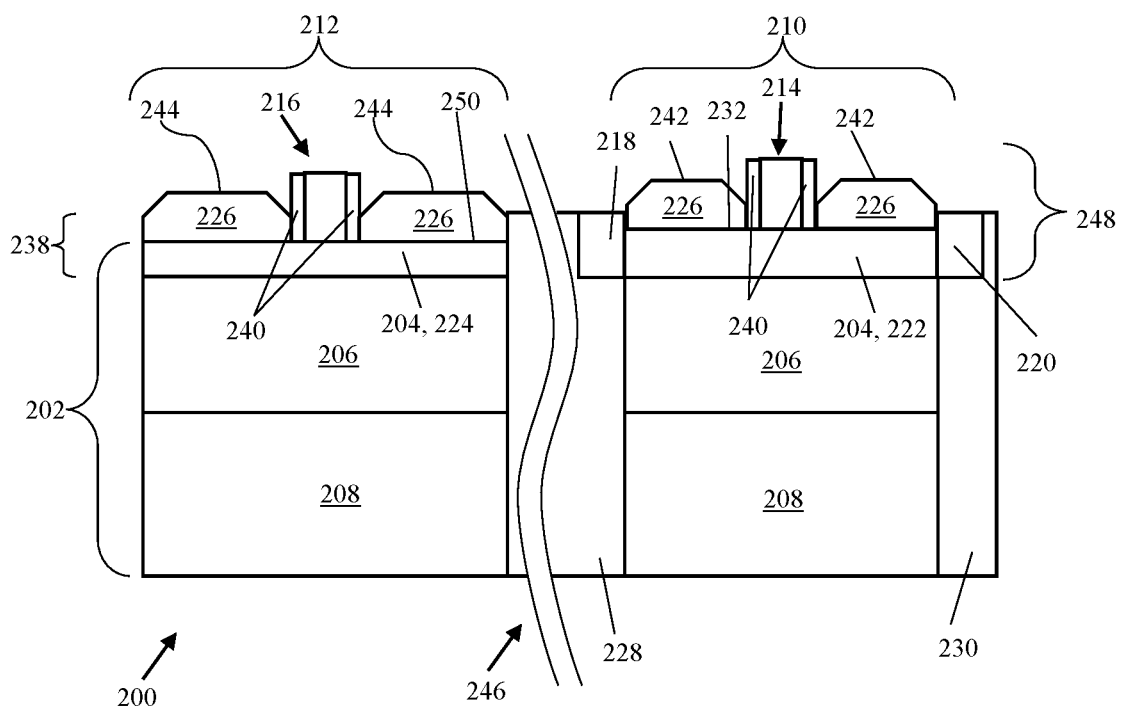
FIG. 4 shows a cross-sectional view of an IC device including regions of vertically-graded silicon germanium, according to embodiments of the disclosure.

FIGS. 2-4 show device 200 according to various alternative embodiments of the disclosure. Device 200 in FIGS. 2-4 may be similar to device 100 in other implementations except that first and second transistor 210, 212 need not be adjacent each other. Moreover, channels 222 and 224 may have different vertical heights.

As illustrated in FIGS. 2-4, device 200 includes substrate 202, which takes the form of an FD-SOI substrate similar to substrate 102, and includes base semiconductor layer 208, buried insulator layer 206 over base semiconductor layer 208, and SOI layer 204 over buried insulator layer 206. SOI layer 204 may take the form of SiGe layer 238 after germanium implantation, deposition, or growth thereon. SiGe layer 238 may be substantially similar to SiGe layer 156 in other implementations.

Device 200 may include a device layer 248, which is a layer near substrate 202 and includes devices fabricated at the front end-of-line (FEOL). FEOL is the first portion of integrated circuit manufacturing that includes fabricating devices (e.g., transistors, capacitors, resistors) on a semiconductor wafer and typically extends to a first metallization. Thus, device layer 248 may include a number of different IC devices on various parts of the chip. As mentioned previously, devices described herein in device layer 248 need not, but may be, adjacent one another.

Device 200 may include first and second transistors 210, 212 in device layer 248 over substrate 202. Second transistor 212 may be anywhere on the chip and is not necessarily adjacent to first transistor 210. Break 246 illustrates that first and second transistors 210, 212 may be in different locations on a chip.

Transistors 210, 212 may be substantially similar to transistors 110, 112 in other implementations except first and second regions of SiGe 218, 220 may be substantially uniform or vertically-graded, and channels 222, 224 have different thicknesses. Transistors 210, 212 may also include gate spacers 240 about respective gates 214, 216 and which include, e.g., silicon nitride. Otherwise, transistors 210 and 212 are similar to transistors 110 and 112, i.e., transistors 210 and 212 may include gates 214 and 216 over substrate 202; channel 222 under gate 214 and channel 224 under gate 216; and source and drain regions 226 on either side of channel 222 and either side of channel 224. In one embodiment, source/drain regions 226 of first transistor 210 have respective uppermost surfaces 242 above respective uppermost surfaces 244 of source/drain regions 226 of second transistor 212, which contributes to different Vth values between first and second transistors 210, 212.

First transistor 210 may include first and second regions of SiGe 218, 220 on either side of channel 222. In one embodiment, first, second regions of SiGe 218, 220 first and second may include vertically-graded SiGe. In other embodiments, however, first and second regions of SiGe 218, 220 may include substantially uniformly-graded SiGe. In yet another embodiment, channel 222 may include materials other than germanium, potentially making a material composition thereof distinct from first and second regions of SiGe 218, 220. In yet another embodiment, channel 222 may be of a higher germanium concentration than a germanium concentration of first portion of SiGe 218 and a germanium concentration of second portion of SiGe 220. The material composition, density, or germanium concentration differences may contribute to Vth modulation of first transistor 210.

First and second regions of SiGe 218, 220 may be adjacent channel 222 in a number of configurations. For example, in one embodiment illustrated in FIG. 2, first and second regions of SiGe 218, 220 may be directly under source/drain regions 226. In another embodiment illustrated in FIG. 3, first and second portions of SiGe 218, 220 may be partially under source/drain regions 226 and bounded on two sides by a first and second isolation region 228 and a second isolation regions 230, respectively. First and second isolation regions 228 and 230 may be substantially similar to isolations regions 128 and 130 in other implementations, i.e., first and second isolation regions 228 and 230 may serve as physical and electrical insulators between transistors 210 and 212 and other devices on chip. In yet another embodiment illustrated in FIG. 4, first and second portions of SiGe 218, 220 may be bounded on two sides by first and second isolation regions 228, 230, respectively. In such an embodiment, source/drain regions 226 may have no part thereof directly over first and second regions of SiGe 218, 220. In yet another embodiment, shown in FIGS. 2-4, channel 222 includes an uppermost surface 232 above an uppermost surface 250 of channel 224 of second transistor 212. Different configurations give different Vth values and provide physical protection to channel 222.

Still referring to FIGS. 2-4, in some embodiments, channel 224 of second transistor 212 may be thinner than first and second portions of SiGe 218, 220 of first transistor 210, thereby implementing different Vth values between first transistor 210 and second transistor 212. In yet another embodiment, channel 224 of second transistor 212 may include intrinsic silicon (i.e., substantially pure silicon). In other embodiments, channel 224 includes SiGe and is of a higher germanium concentration than a germanium concentration of first portion of SiGe 218 and a germanium concentration of second portion of SiGe 220. As mentioned previously, differences in material composition, density, or germanium concentration between the channels 222, 224 of transistors 210, 212, respectively, may contributes to different Vth values between first and second transistors 210, 212.

Figure 5:
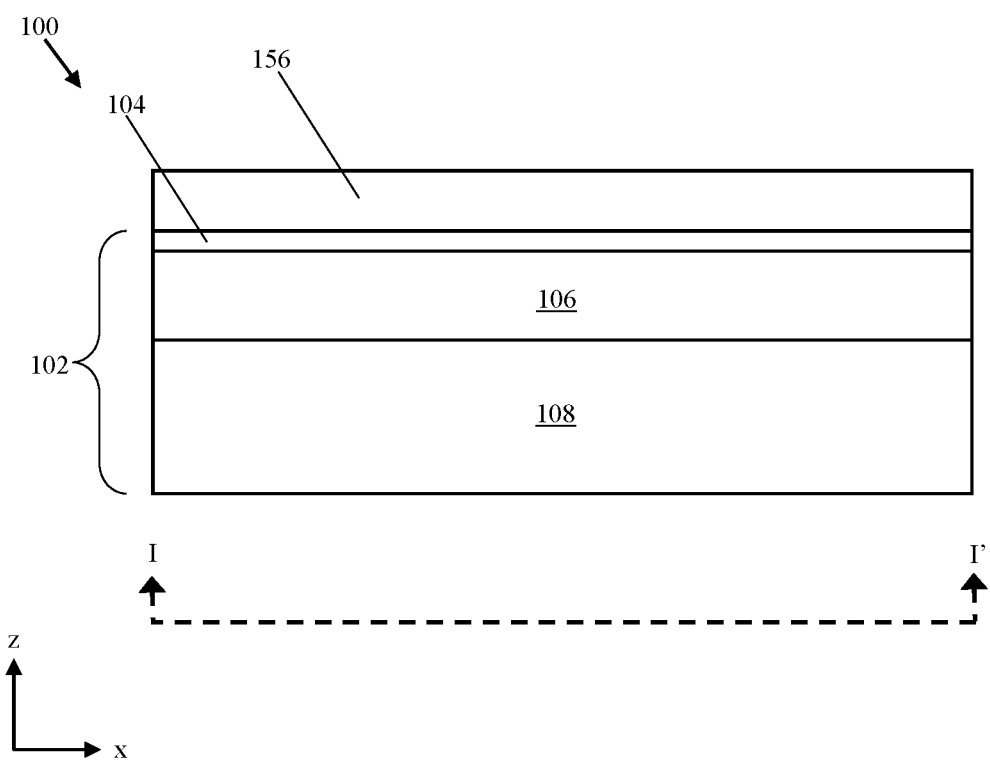
FIG. 5 shows a cross-sectional view of a preliminary structure for a method of fabrication, according to embodiments of the disclosure.
Figure 6:
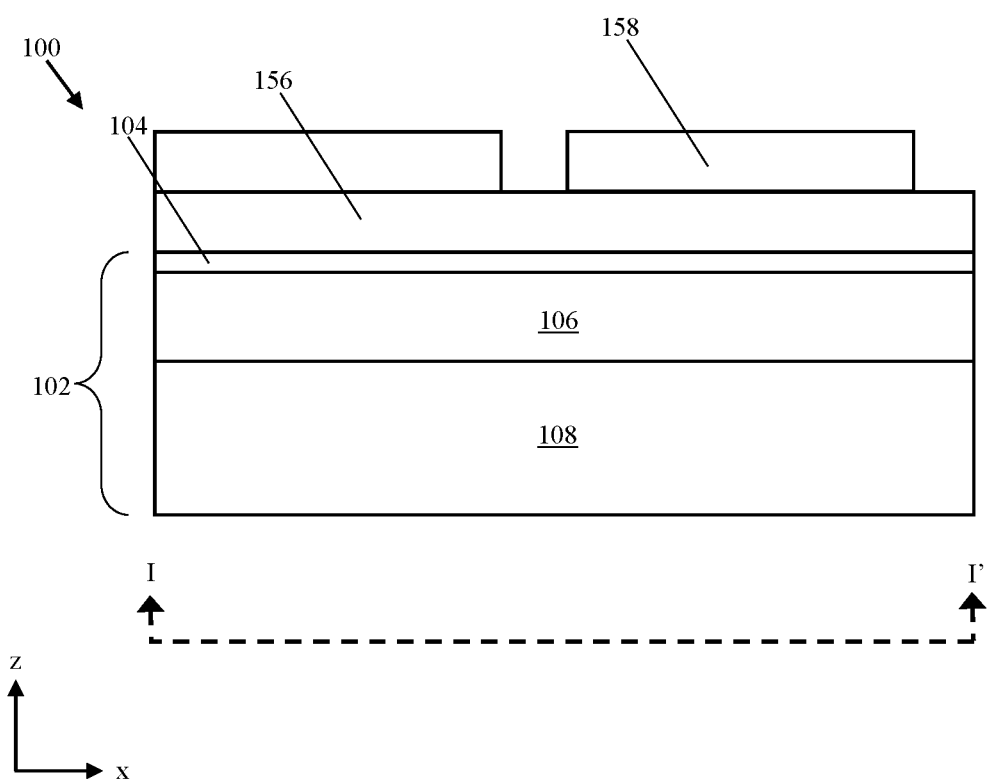
FIG. 6 shows a cross-sectional view of the preliminary structure after forming a layer of oxide thereover, according to embodiments of the disclosure.
Figure 7:
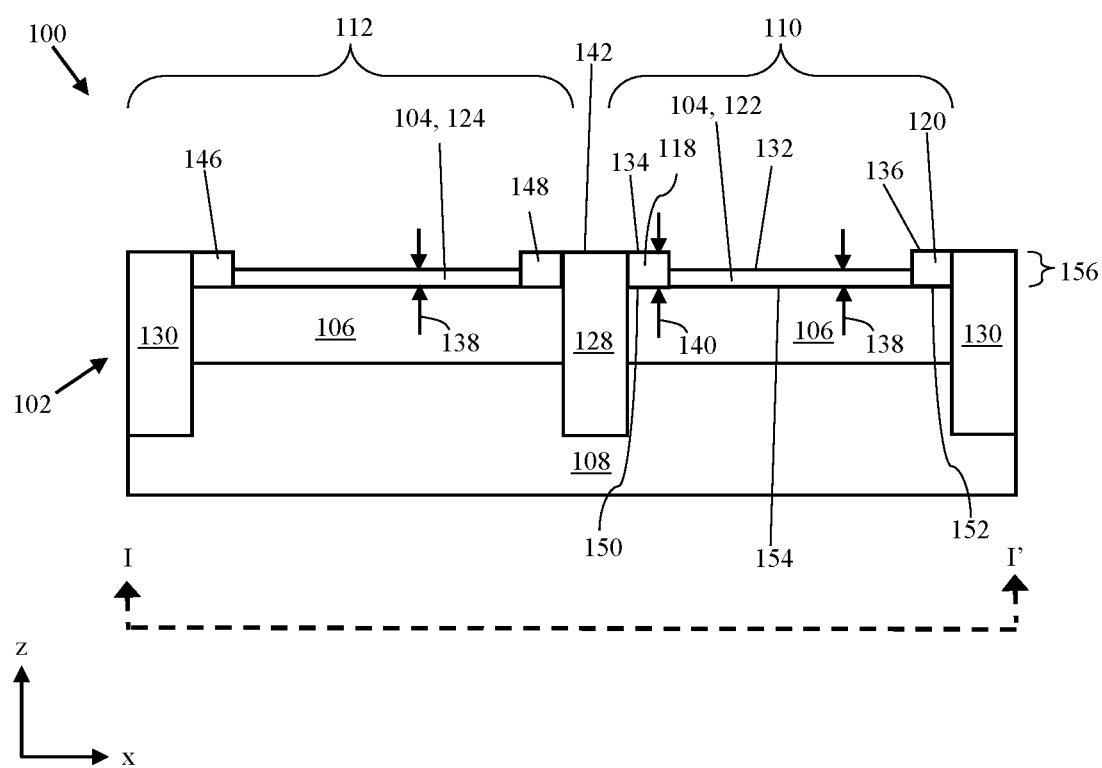
FIG. 7 shows a cross-sectional view of the preliminary structure after forming regions of vertically-graded silicon germanium and trench isolations, according to embodiments of the disclosure.

FIGS. 5-7 show cross sectional views of device 100 at various stages of fabrication according to implementations. FIG. 5 shows substrate 102 at a preliminary stage of fabrication. Forming substrate 102 may include forming FD-SOI layers thereon. When substrate 102 includes SOI or FD-SOI technology, similar to other implementations, substrate 102 further includes forming buried insulator layer 106 over base semiconductor layer 108, and forming SOI layer 104 over buried insulator layer 106. Alternatively, SOI wafers may be purchased with base semiconductor layer 108, buried insulator layer 106, and SOI layer 104 preformed thereon.

SiGe layer 156 may be formed, e.g., by deposition, epitaxially growing, or implanting germanium onto or into SOI layer 104. That is, forming SiGe layer 156 may include doping SOI layer 104. The doping may include using an ion implanter. Ion implanting includes using an inert carrier gas, such as nitrogen, to bring the impurity source (dopant) into the intrinsic silicon of SOI layer 104, thereby making SOI layer 104 extrinsic/doped. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Depending on fabrication method, SiGe layer 156 may include vertically-graded SiGe or substantially uniform SiGe. Specifically, when SiGe layer 156 is formed, germanium atoms are, for example, deposited, implanted, or grown over or within SOI layer 104. Germanium penetrates SOI layer 104 and bonds with the silicon therein, forming SiGe layer 156. When germanium is implanted on SOI layer 104, less germanium atoms may penetrate further into substrate 102 than at the top, thereby creating a vertical gradient of germanium atoms within SOI layer 104. In other formation methods, however, SiGe layer 156 may be formed substantially uniformly distributed.

During formation of SiGe layer 156, all the germanium atoms in SiGe layer 156 are deposited or grown in one step. Once the germanium atoms are formed on device 100, the germanium atoms are rearranged within the silicon lattice of SOI layer 104 through, e.g., an oxide growth or deposition step and/or a thermal anneal. Condensed SiGe may be formed through heat treatment, e.g., thermal oxidation, where the condensed SiGe reduces in volume, but germanium concentration stays the same and becomes substantially uniformly distributed therein. In such cases, the entire wafer is subjected to a heat treatment to reduce the volume of SiGe layer 156 by displacing germanium atoms.

FIG. 6 shows device 100 after forming oxide layer 158. When oxide layer 158 is formed, the oxide therein applies pressure to portions of SiGe layer 156, thereby condensing SiGe layer 156, i.e., reducing the volume of the SiGe portions under oxide layer 158. Condensed portions of SiGe layer 156 are of a higher germanium concentration than a germanium concentration portions of uncondensed SiGe layer 156. That is, condensed portions of SiGe layer 156 have a higher germanium content per unit volume than uncondensed portions of SiGe layer 156. Depending on the initial formation method, uncondensed portions of SiGe layer 156 may include uniformly distributed or vertically-graded germanium atoms.

FIG. 7 shows device 100 after forming the preliminary structures of transistors 110, 112. At this step, isolation region 128, and optionally additional isolation regions 130, are formed within substrate 102. Isolation layers 128, 130 may be formed by etching trenches in base semiconductor substrate 108 and then filling the trenches with a dielectric or insulative material. Isolation regions 128, 130 may be formed spatially separated so that a device, such as a transistor, capacitor, or resistor, may be formed therebetween.

Channels 122, 124 may be formed simultaneously with regions of vertically-graded SiGe 118, 120, 146, 148. Forming channel 124 may include masking thereover prior to forming SiGe layer 156 to render channel 124 substantially free of germanium. Thus, channel 124 of second transistor 112 may be formed including intrinsic silicon from SOI layer 104. In another embodiment shown in FIG. 1, channel 122 is formed including a higher germanium concentration than a germanium concentration of first region of vertically-graded SiGe 118 and a germanium concentration of second regions of vertically-graded SiGe 120 after condensation of SiGe layer 156 in channel 122 region.

The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask." Mask may include a developable organic planarization layer (OPL) on the layer to be etched, a developable anti-reflective coating (ARC) layer on the developable OPL, and a photoresist mask layer on the developable ARC layer. Masks may be removed using any known removal process appropriate for the mask material, e.g., a wet etch for hard nitride mask or an ashing process (oxygen dry strip process) for a soft resist-based mask.

Patterning can be done with photolithography. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is first patterned by exposing the resist to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

As mentioned previously, regions of vertically-graded SiGe 118, 120, 146, 148 and channels 122, 124 are formed simultaneously by condensing part of SiGe layer 156 with, e.g., a thermal oxidation step, thereby forming channels 122, 124 and leaving first and second regions of vertically-graded SiGe 118, 120 and third and fourth regions of vertically-graded SiGe 146, 148 uncondensed. Regions of SiGe layer 156 are left uncondensed by masking or otherwise physically covering those regions prior to performing any condensation steps, i.e., SiGe layer 156 may be selectively condensed by forming a mask thereon and subsequently removing or condensing portion(s) of silicon germanium layer.

In one embodiment, as shown in FIG. 1B, forming first region of vertically-graded SiGe 118 and second region of vertically-graded SiGe 120 includes forming uppermost surface 134 of first region of vertically-graded SiGe 118 and uppermost surface 136 of second region of vertically-graded SiGe 120 substantially vertically aligned with uppermost surface 142 of first isolation region 128 by, e.g., a planarization step that simultaneously levels uppermost surfaces 134, 136 of first and second regions of vertically-graded SiGe 118, 120 and uppermost surface 142 of isolation region 128. However, first and second regions of vertically-graded SiGe 118, 120 may be formed with respective uppermost surfaces 134, 136 vertically above or below uppermost surface 142 of isolation region 128.

Continuing with FIGS. 1A-1C, the drawings show completed device 100 including completed first and second transistors 110, 112 after forming gates 114, 116 thereover through, e.g., metal damascene or some other additive manufacturing process. In one embodiment, gates 114, 116 may be formed extending at least partially or completely over first and second regions of vertically-graded SiGe 118, 120. Similarly, gate 116 may be formed extending at least partially or completely over third and fourth regions of vertically-graded SiGe layers 146, 148. Completed transistors 110, 112 may have different respective Vth values because of the foregoing formation differences.

The method and structure as described above are used in the fabrication and operation of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) device, comprising:
   a substrate; and
   a first transistor over the substrate, including:
   a gate over the substrate and between a source region and a drain region,
   a first region of vertically-graded silicon germanium ("SiGe") adjacent a first side of a channel under the gate, and
   a second region of vertically-graded SiGe adjacent a second side of the channel, wherein the channel includes substantially uniformly-graded SiGe.

2. The IC device of claim 1, wherein the channel includes a higher germanium concentration than a germanium concentration of the first region of vertically-graded SiGe and a germanium concentration of the second region of vertically-graded SiGe.

3. The IC device of claim 1, wherein the gate is over the first region of vertically-graded SiGe and the second region of vertically-graded SiGe.

4. The IC device of claim 1, further comprising a second transistor adjacent the first transistor, the second transistor including:
a gate over the substrate and between a source region and a drain region; and
a channel under the gate and including intrinsic silicon.

5. The IC device of claim 4, further including an isolation region between the first transistor and the second transistor.

6. The IC device of claim 4, wherein the second transistor further includes a third region of vertically-graded SiGe and a fourth region of vertically-graded SiGe, and wherein the channel of the second transistor is between the third region of vertically-graded SiGe and the fourth region of vertically-graded SiGe.

7. The IC device of claim 4, wherein the channel of the second transistor has a first vertical height, and the first region of vertically-graded SiGe and the second region of vertically-graded SiGe have a second vertical height, and wherein the first vertical height is approximately half of the second vertical height.

8. The IC device of claim 1, wherein the channel has an uppermost surface below uppermost surfaces of the first region of vertically-graded SiGe and of the second region of vertically-graded SiGe.

9. The IC device of claim 8, wherein the channel of the first transistor has a first vertical height, and the first region of vertically-graded SiGe and the second region of vertically-graded SiGe have a second vertical height, and
wherein the first vertical height is approximately half of the second vertical height.

10. The IC device of claim 1, wherein the first region of vertically-graded SiGe and the second region of vertically-graded SiGe substantially surround the channel, the source region, and the drain region of the first transistor.

11. The IC device of claim 1, wherein the first region of vertically-graded SiGe and the second region of vertically-graded SiGe have respective bottommost surfaces substantially vertically aligned with a bottommost surface of the channel.

12. An integrated circuit (IC) device, comprising:
a first transistor in a device layer over a fully-depleted semiconductor-on-insulator (FD-SOI) substrate, including:
a gate over the FD-SOI substrate and between a source and a drain; and
a channel under the gate and between a first portion of silicon-germanium (SiGe) and a second portion of SiGe, wherein the channel is of a higher germanium concentration than a germanium concentration of the first portion of SiGe and a germanium concentration of the second portion of SiGe; and
a second transistor in the device layer, including:
a gate over the FD-SOI substrate and between a source and a drain; and
a channel under the gate, wherein the channel of the second transistor is thinner than the first and second portions of SiGe of the first transistor.

13. The IC device of claim 12, wherein the channel of the second transistor further includes SiGe, the channel of the second transistor being of a higher germanium concentration than a germanium concentration of the first portion of SiGe and a germanium concentration of the second portion of SiGe.

14. The IC device of claim 12, wherein the channel of the second transistor includes intrinsic silicon.

15. The IC device of claim 12, wherein the first portion of SiGe and the second portion of SiGe each include vertically-graded SiGe.

16. A method of forming an integrated circuit (IC) structure, comprising:
forming a first transistor over a substrate, including:
forming a channel including substantially uniformly-graded silicon-germanium (SiGe) within the substrate,
forming a gate over the channel,
forming a source region and a drain region on opposing sides of the gate;
forming a first region of vertically-graded SiGe adjacent a first side of the channel, and
forming a second region of vertically-graded SiGe adjacent a second side of the channel.

17. The method of claim 16, wherein forming the channel further includes forming SiGe therein that is of a higher germanium concentration than a germanium concentration of the first region of vertically-graded SiGe and a germanium concentration of the second region of vertically-graded SiGe.

18. The method of claim 16, wherein forming the gate further includes forming the gate over the first region of vertically-graded SiGe and the second region of vertically-graded SiGe.

19. The method of claim 16, further including forming a second transistor adjacent the first transistor, including:
forming a gate over the substrate;
forming a channel under the gate, the channel including intrinsic silicon,
forming a source region adjacent a first side of the channel, and
forming a drain region adjacent a second side of the channel.

20. The method of claim 16, further comprising forming the first region of vertically-graded SiGe and the second region of vertically-graded SiGe substantially surrounding the channel, the source region, and the drain region of the first transistor.

* * * * *